(12) United States Patent
Kwak et al.

(10) Patent No.: US 8,598,702 B2
(45) Date of Patent: Dec. 3, 2013

(54) SEMICONDUCTOR PACKAGE

(75) Inventors: Young Hoon Kwak, Gyunggi-do (KR);
Kwang Soo Kim, Gyunggi-do (KR);
Young Ki Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 100 days.

(21) Appl. No.: 13/408,829

(22) Filed: Feb. 29, 2012

(65) Prior Publication Data

US 2013/0154083 A1 Jun. 20, 2013

(30) Foreign Application Priority Data

Dec. 14, 2011 (KR) .................. 10-2011-0134549

(51) Int. Cl.
*H01L 23/34* (2006.01)

(52) U.S. Cl.
USPC .... 257/714; 257/712; 257/713; 257/E23.088; 257/E23.07; 257/E23.098; 361/677; 361/679.46; 361/679.47; 361/679.52; 361/679.53; 174/15.1; 174/15.2

(58) Field of Classification Search
USPC .................. 257/678, 714, E23.088, E23.098; 361/677, 679.46, 679.47, 679.52, 361/679.53; 174/15.1, 15.2
See application file for complete search history.

(56) References Cited

U.S. PATENT DOCUMENTS

| | | | |
|---|---|---|---|
| 7,978,473 B2 * | 7/2011 | Campbell et al. | 361/699 |
| 2003/0062149 A1 * | 4/2003 | Goodson et al. | 165/104.11 |
| 2008/0230894 A1 * | 9/2008 | Heydari et al. | 257/714 |
| 2008/0239663 A1 * | 10/2008 | Yamamoto et al. | 361/691 |

FOREIGN PATENT DOCUMENTS

| | | |
|---|---|---|
| JP | 2006-294921 A | 10/2006 |
| JP | 2011-228461 A | 11/2011 |
| KR | 10-2011-0014867 | 2/2011 |

OTHER PUBLICATIONS

Office action dated Apr. 18, 2013 for Korean Patent Application No. 10-2011-0134549 and its English summary provided by the Applicant.

* cited by examiner

*Primary Examiner* — Jasmine Clark
(74) *Attorney, Agent, or Firm* — Ladas & Parry, LLP

(57) ABSTRACT

Disclosed herein is a semiconductor package. The semiconductor package includes a semiconductor module, a first heat dissipation unit, a second heat dissipation unit and a housing. The semiconductor module contains a semiconductor device. The first heat dissipation unit is provided under the semiconductor module. The first heat dissipation unit includes at least one first pipe through which first cooling water passes. A first rotator is rotatably disposed in the first pipe. The second heat dissipation unit is provided on the semiconductor module. The second heat dissipation unit includes at least one second pipe through which second cooling water passes. A second rotator is rotatably disposed in the second pipe. The housing is provided on opposite sides of the semiconductor module, the first heat dissipation unit and the second heat dissipation unit and supports the semiconductor module, the first heat dissipation unit and the second heat dissipation unit.

17 Claims, 7 Drawing Sheets

SEMICONDUCTOR PACKAGE

CROSS REFERENCE TO RELATED APPLICATION

This application claims the benefit of Korean Patent Application No. 10-2011-0134549, filed Dec. 14, 2011, entitled "SEMICONDUCTOR PACKAGE", which is hereby incorporated by reference in its entirety into this application.

BACKGROUND OF THE INVENTION

1. Technical Field

The present invention relates to a semiconductor package.

2. Description of the Related Art

As the power electronics industry develops, a reduction in the size of semiconductor modules and their densification become more important. Therefore, not only reducing the sizes of semiconductor devices themselves but also reducing the sizes of modules is an important factor. However, integration of devices in limited space becomes a cause of an increase of heat generation. Reducing the heat generation is a growing issue because heat affects the operation and lifetime of the power semiconductor modules.

In this regard, a power semiconductor package is configured in such a way that a plurality of semiconductor devices are mounted on a single insulation board by soldering and installed in a housing, and then wire-bonding or soldering connects the semiconductor devices to the board and connects the board to terminals provided in the housing. Furthermore, a heat dissipation plate for heat dissipation of the semiconductor package is disposed under the package. However, because the heat dissipation plate is provided only under the package, the heat dissipation efficiency is comparatively low (Korean Patent Laid-open Publication No. 10-2011-0014867).

SUMMARY OF THE INVENTION

The present invention has been made in an effort to provide a semiconductor package having an improved heat dissipation effect.

In a semiconductor package according to an embodiment of the present invention, a semiconductor module has a semiconductor device. A first heat dissipation unit is provided under the semiconductor module. The first heat dissipation unit includes at least one first pipe through which first cooling water passes, and a first rotator disposed in the first pipe so as to be rotatable. A second heat dissipation unit is provided on the semiconductor module. The second heat dissipation unit includes at least one second pipe through which second cooling water passes, and a second rotator disposed in the second pipe so as to be rotatable. A housing is provided on opposite sides of the semiconductor module, the first heat dissipation unit and the second heat dissipation unit. The housing supports the semiconductor module, the first heat dissipation unit and the second heat dissipation unit.

In the semiconductor package, a first inlet port may be provided on a first surface of the housing so that the first cooling water is supplied from an outside into the first heat dissipation unit through the first inlet port. A second outlet port may be provided on the first surface of the housing so that the second cooling water which has been used in the second heat dissipation unit is discharged to the outside through the second outlet port.

In the semiconductor package, a first outlet port may be provided on a second surface of the housing so that the first cooling water which has been used in the first heat dissipation unit is discharged to the outside through the first outlet port. A second inlet port may be provided on the second surface of the housing so that the second cooling water is supplied from the outside into the second heat dissipation unit through the second inlet port.

The first rotator may be disposed in a first side of the first pipe.

A first spiral groove may be formed in an inner surface of a second side of the first pipe.

The first rotator may have a length corresponding to a length of the first pipe.

The first rotator may a cylindrical center shaft and a spiral blade. The spiral blade is provided around an outer surface of the cylindrical center shaft.

A pitch of the spiral blade may be constant.

A pitch of the spiral blade may be reduced from a first side of the spiral center shaft to a second side thereof.

The first rotator may be made of a thermal conductive material.

The second rotator may be disposed in a second side of the second pipe.

A second spiral groove may be formed in an inner surface of a first side of the second pipe.

The second rotator may have a length corresponding to a length of the second pipe.

The second rotator may include a cylindrical center shaft and a spiral blade. The spiral blade may be provided around an outer surface of the cylindrical center shaft.

A pitch of the spiral blade may be constant.

A pitch of the spiral blade may be reduced from a first side of the spiral center shaft to a second side thereof.

The second rotator may be made of a thermal conductive material.

DESCRIPTION OF THE PREFERRED EMBODIMENTS

Figure 1:
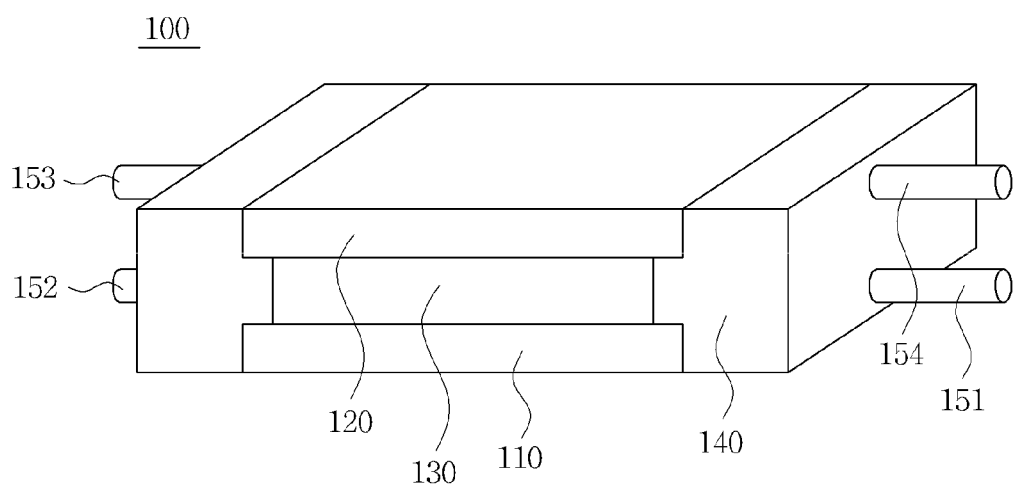
FIG. 1 is a view illustrating a semiconductor package according to an embodiment of the present invention.

Reference now should be made to the drawings, in which the same reference numerals are used throughout the different drawings to designate the same or similar components. If in the specification, detailed descriptions of well-known functions or configurations may unnecessarily make the gist of the present invention obscure, the detailed descriptions will be omitted. The terms and words used in the present specification and the accompanying claims should not be limitedly interpreted as having their common meanings or those found in dictionaries, but should be interpreted as having meanings adapted to the technical spirit of the present invention on the basis of the principle that an inventor can appropriately define the concepts of terms in order to best describe his or her invention.

Furthermore, it will be understood that, although the terms "first", "second" etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

Hereinafter, embodiments of a semiconductor package according to the present invention will be described in detail with reference to the attached drawings.

FIG. 1 is a view illustrating a semiconductor package according to an embodiment of the present invention.

Referring to FIG. 1, the semiconductor package 100 includes a semiconductor module 130, a first heat dissipation unit 110, a second heat dissipation unit 120, a housing 140, a first inlet port 151, a first outlet port 152, a second inlet port 153 and a second outlet port 154.

The semiconductor module 130 contains semiconductor devices. The semiconductor devices may be power devices that have high heat generation rates.

The first heat dissipation unit 110 is disposed under the semiconductor module 130. Cooling water passes through the first heat dissipation unit 110 to cool the semiconductor module 130 having a high heat generation rate. The first heat dissipation unit 110 includes at least one first pipe (not shown) which allows the cooling water to pass through the first heat dissipation unit 110.

The second heat dissipation unit 120 is disposed on the semiconductor module 130. Cooling water passes through the second heat dissipation unit 120 to cool the semiconductor module 130 having a high heat generation rate. The second heat dissipation unit 120 includes at least one second pipe (not shown) which allows the cooling water to pass through the second heat dissipation unit 120.

The housing 140 is provided on opposite sides of the semiconductor module 130, the first heat dissipation unit 110 and the second heat dissipation unit 120. The housing 140 having the above-mentioned configuration functions to support the semiconductor module 130, the first heat dissipation unit 110 and the second heat dissipation unit 120.

The first inlet port 151 is provided on a first surface of the housing 140. External cooling water is drawn into the first heat dissipation unit 110 through the first inlet port 151. In other words, the first inlet port 151 connects a first side of the first heat dissipation unit 110 to the outside.

The first outlet port 152 is provided on a second surface of the housing 140. The first outlet port 152 is configured such that cooling water which has been used in the first heat dissipation unit 110 is discharged to the outside through the first outlet port 152. In other words, the first outlet port 152 connects a second side of the first heat dissipation unit 110 to the outside.

The first inlet port 151 and the first outlet port 152 are disposed at the same height as that of the first heat dissipation unit 110 to facilitate the connection to the first heat dissipation unit 110.

The second inlet port 153 is formed on the second surface of the housing 140. External cooling water is drawn into the second heat dissipation unit 120 through the second inlet port 153. In other words, the second inlet port 153 connects a second side of the second heat dissipation unit 120 to the outside.

The second outlet port 154 is provided on the first surface of the housing 140. The second outlet port 154 is configured such that cooling water which has been used in the second heat dissipation unit 120 is discharged to the outside through the second outlet port 154. In other words, the second outlet port 154 connects a first side of the second heat dissipation unit 120 to the outside.

The second inlet port 153 and the second outlet port 154 are disposed at the same height as that of the second heat dissipation unit 120 to facilitate the connection to the second heat dissipation unit 120.

In the semiconductor package having the above-mentioned construction, the heat dissipation units through which cooling water circulates are provided on and under the semiconductor module having a high heat generation rate, thus enhancing the heat dissipation efficiency.

Figure 2:
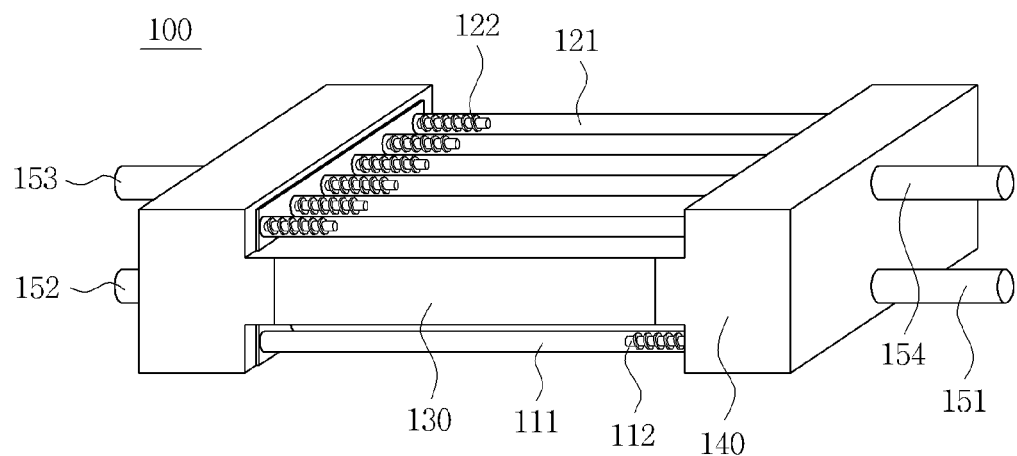
FIG. 2 is a view showing the internal construction of the semiconductor package according to the embodiment of the present invention.

FIG. 2 is a view showing the internal construction of the semiconductor package according to the embodiment of the present invention.

Referring to FIG. 2, the semiconductor package 100 includes the first heat dissipation unit 110, the second heat dissipation unit 120 and the housing 140.

The first heat dissipation unit 110 includes a plurality of first pipes 111. The first pipes 111 are passages through which cooling water passes. The cooling water is supplied from the outside into the first heat dissipation unit 110 through the first inlet port 151 which is formed on the first surface of the housing 140. Further, the cooling water which has passed through the first heat dissipation unit 110 is discharged to the outside through the first outlet port 152 which is formed on the second surface of the housing 140. Each first pipe 111 has a first rotator 112 in a first side thereof. In other words, the first rotators 112 are provided in the respective first pipes 111 and disposed at the first sides of the first pipes 111 into which cooling water is drawn. When cooling water is supplied into the first pipes 111, the flow of the cooling water rotates the first rotators 112. The rotation of the first rotators 112 stirs the cooling water in the first pipes 111. In other words, the rotation of the first rotators 112 mixes cooling water, which is adjacent to the upper portion of each first pipe 111 that has a high temperature because of the proximity to the semiconductor module 130, with cooling water which is adjacent to the lower portion of the first pipe 111 that has a comparatively low temperature. As such, the first rotators 112 stir cooling water so that the temperature of cooling water adjacent to the semiconductor module 130 can be maintained at a comparatively low degree, thus enhancing the heat dissipation efficiency.

The second heat dissipation unit 120 includes a plurality of second pipes 121. The second pipes 121 are passages through which cooling water passes. The cooling water is supplied from the outside into the second heat dissipation unit 120 through the second inlet port 153 which is formed on the second surface of the housing 140. Further, the cooling water which has passed through the second heat dissipation unit 120 is discharged to the outside through the second outlet port 154 which is formed on the first surface of the housing 140. Each second pipe 121 has a second rotator 122 in a second side thereof. In other words, the second rotators 122 are provided in the respective second pipes 121 and disposed at the second sides of the second pipes 121 into which cooling water is drawn. When cooling water is supplied into the second pipes 121, the flow of the cooling water rotates the second rotators 122. The rotation of the second rotators 122 stirs the cooling water in the second pipes 121. In other words, the rotation of the second rotators 122 mixes cooling water, which is adjacent to the lower portion of each second pipes 121 that has a high temperature because of the proximity to the semiconductor module 130, with cooling water which is adjacent to the upper portion of the second pipe 121 that has a comparatively low temperature. As such, the second rotators 122 stir cooling water so that the temperature of cooling water adjacent to the semiconductor module 130 can be maintained at a comparatively low degree, thus enhancing the heat dissipation efficiency.

Figure 3:
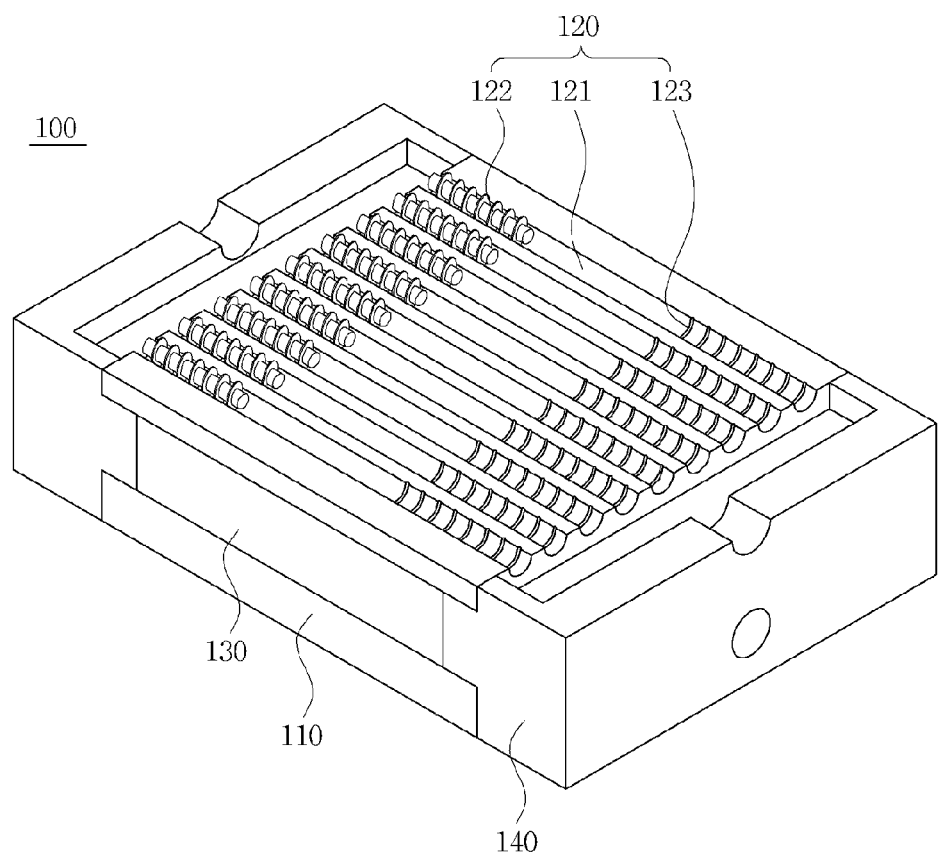
FIG. 3 is a top perspective sectional view showing the upper portion of the semiconductor package according to the present invention.

FIG. 3 is a top perspective sectional view showing the upper portion of the semiconductor package according to another embodiment of the present invention.

Referring to FIG. 3, the semiconductor package 100 includes a first heat dissipation unit 110, a second heat dissipation unit 120, a semiconductor module 130 and a housing 140.

In the semiconductor package 100, the first heat dissipation unit 110, the semiconductor module 130 and the second heat dissipation unit 120 are disposed in the sequence from the bottom to the top and are supported by the housing 140.

The second heat dissipation unit 120 is disposed on the semiconductor module 130.

The second heat dissipation unit 120 includes a plurality of second pipes 121. A second rotator 122 and a second groove 123 are formed in each second pipe 121. The second rotator 122 is disposed in a second side of the second pipe 121. The second groove 123 which spirals is formed in the inner surface of a first side of the second pipe 121. Cooling water that is supplied into the second side of the second heat dissipation unit 120 is rotated by the second rotators 122. The rotation of the second rotators 122 can mix cooling water the temperature of which has increased because of the proximity to the semiconductor module 130 with cooling water of a low temperature. As such, because cooling water of a high temperature mixes with cooling water of a low temperature, the temperature of the high-temperature cooling water can be relatively reduced. In other words, the temperature of cooling water which is adjacent to the semiconductor module 130 is prevented from increasing to a predetermined degree or more. Thereby, the heat dissipation efficiency of the semiconductor module 130 can be enhanced.

However, the rotational force of cooling water that is derived from the second rotators 122 may gradually weaken as the cooling water flows from the second side of the second heat dissipation unit 120 to the first side thereof. Thus, in the first side of the second heat dissipation unit 120, cooling water of a high temperature may not effectively mix with cooling water of a low temperature. As a result, there may be a difference in heat dissipation efficiency between the first and second sides of the second heat dissipation unit 120. To avoid this problem, in this embodiment, the second spiral groove 123 is formed in the inner surface of the first side of each second pipe 121. In this case, the rotational force of cooling water that is weakening after having passed through the second side of the second pipe 121 can be enhanced at the first side of the second pipe 121 by the second spiral groove 123. That is, the rotational force of cooling water can be appropriately maintained in the whole length of the second pipe 121 so that the temperature of cooling water can be uniformly maintained.

The first heat dissipation unit 110 is disposed under the semiconductor module 130 and includes a plurality of first pipes (not shown). Although it is not shown in FIG. 3, each first pipe has the same construction as that of the second pipe 121, leading to the same effect.

Figure 4:
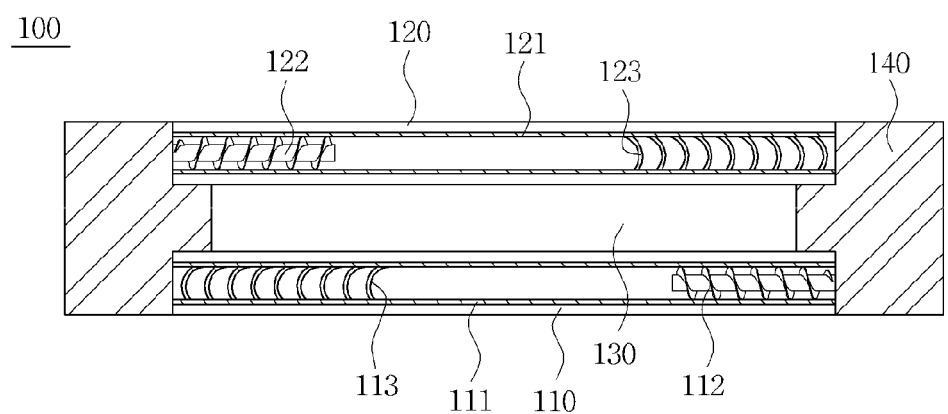
FIG. 4 is a side sectional view of the semiconductor package.

FIG. 4 is a side sectional view of the semiconductor package 100.

Referring to FIG. 4, in the semiconductor package 100, the first heat dissipation unit 110, the semiconductor module 130 and the second heat dissipation unit 120 are disposed in the sequence from the bottom to the top and are supported by the housing 140.

The first heat dissipation unit 110 is disposed under the semiconductor module 130. The first heat dissipation unit 110 includes first pipes 111 which are passages through which cooling water passes. A first rotator 112 is disposed in a first side of each first pipe 111. The first rotator 112 enables cooling water that is supplied into the first pipe 111 to rotate while flowing to a second side of the first pipe 111. The rotation of the first rotators 112 can mix cooling water the temperature of which has increased because of the proximity to the semiconductor module 130 with cooling water of a low temperature. As such, because cooling water of a high temperature mixes with cooling water of a low temperature, the temperature of cooling water which is adjacent to the semiconductor module 130 is prevented from increasing any further, in other words, it can be maintained at an appropriate temperature.

Furthermore, a first groove 113 is formed in a second side of each first pipe 111. The first groove 113 is spiral and increases the rotational force of cooling water which has reduced while the cooling water moves from the first side of the first pipe 111 to the second side thereof. Therefore, the rotational force of cooling water can be maintained at a similar level between the first and second sides of the second pipe 121 by the first spiral groove 113. Thereby, cooling water can maintain a uniform temperature in the whole length of the first pipe 111.

However, even if the first heat dissipation unit 110 includes the first rotators 112 and the first grooves 113, there is a difference in temperature between cooling water that is just supplied from the outside into the first heat dissipation unit 110 and cooling water which has absorbed heat radiated from the semiconductor module 130 while passing through the first heat dissipation unit 110 and then is discharged to the outside. Therefore, there may be a difference in heat dissipation efficiency between the first side of the first heat dissipation unit 110 into which cooling water is supplied and the second side of the first heat dissipation unit 110 from which the cooling water is discharged.

Therefore, to compensate for this, the second heat dissipation unit 120 which is disposed on the semiconductor module 130 is configured such that it is symmetric with the first heat dissipation unit 110.

In other words, the second heat dissipation unit 120 is oriented such that cooling water is supplied into the second side thereof and discharged to the outside from the first side.

The second rotators 122 are disposed in the second side of the second heat dissipation unit 120. The second spiral grooves 123 are formed in the inner surface of the first side of the second heat dissipation unit 120.

As such, because the first heat dissipation unit 110 and the second heat dissipation unit 120 are configured such that they are symmetric with each other, the heat dissipation efficiency can be maintained at a similar degree in the whole area of the semiconductor module 130.

Figure 5:
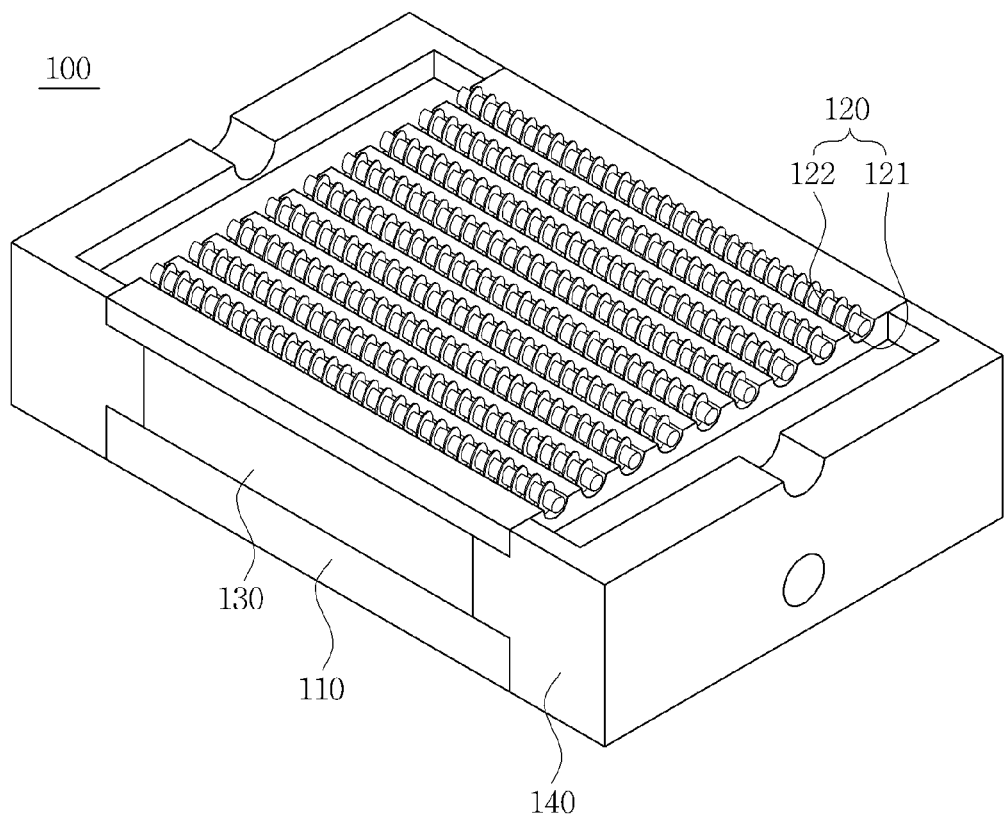
FIG. 5 is a view illustrating a semiconductor package according to another embodiment of the present invention.

FIG. 5 is a view illustrating a semiconductor package, according to another embodiment of the present invention.

Referring to FIG. 5, the semiconductor package 100 includes a first heat dissipation unit 110, a second heat dissipation unit 120, a semiconductor module 130 and a housing 140.

The second heat dissipation unit 120 is disposed on the semiconductor module 130.

The second heat dissipation unit 120 includes a plurality of second pipes 121. Each second pipe 121 contains a second rotator 122 therein. In detail, the second rotator 122 extends the whole length of the second pipe 121. In other words, the length of the second rotator 122 is the same as that of the second pipe 121. Cooling water that is supplied into the second side of the second heat dissipation unit 120 is rotated by the second rotators 122. The rotation of the second rotators 122 can mix cooling water the temperature of which has increased because of the proximity to the semiconductor module 130 with cooling water of a low temperature. As such, because cooling water of a high temperature mixes with cooling water of a low temperature, the temperature of the high-temperature cooling water can be relatively reduced. In other words, the temperature of cooling water which is adjacent to the semiconductor module 130 is prevented from increasing to a predetermined degree or more. Thereby, the heat dissipation efficiency of the semiconductor module 130 can be enhanced. Further, in this embodiment, because the length of each second rotator 122 is the same as that of the second pipe 121, cooling water can flow from the second side to the first side of the second heat dissipation unit 120 with a uniform rotational force. That is, the rotational force of cooling water can be maintained in the whole length of each second pipe 121, so that the temperature of cooling water can be maintained at a uniform degree.

The first heat dissipation unit 110 is disposed under the semiconductor module 130 and includes a plurality of first pipes (not shown). Although it is not shown in FIG. 5, each first pipe has the same construction as that of the second pipe 121, leading to the same effect.

Figure 6:
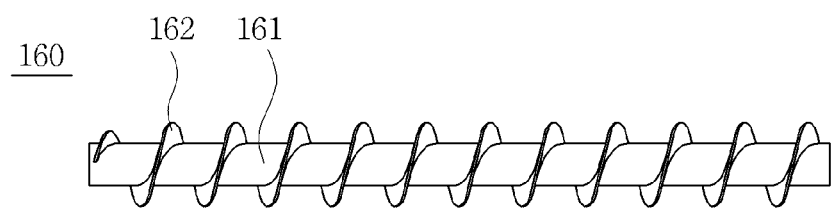
FIG. 6 is a view illustrating an embodiment of the rotator according to the present invention.

FIG. 6 is a view illustrating an embodiment of the rotator according to the present invention.

Referring to FIG. 6, the rotator 160 includes a center shaft 161 and a blade 162.

The rotator 160 is disposed in each pipe of the heat dissipation unit through which cooling water passes.

The center shaft 161 is cylindrical. The center shaft 161 extends a predetermined length in the longitudinal direction of the pipe into which the rotator 160 is inserted. The length of the center shaft 161 is equal to or less than that of the pipe into which the rotator 160 is inserted. In other words, the maximum length of the rotator 160 is the same as that of the pipe. The length of the rotator 160 is not limited to this, and it can be easily understood by those skilled in this art that modifications are possible. The center shaft 161 may be made of thermal conductive material. In addition, the material of the center shaft 161 may be a moisture-resistant material.

The blade 162 is provided in a spiral shape around the outer surface of the center shaft 161. Further, the blade 162 may be configured such that a wide surface thereof is angled to the center shaft 161 at a predetermined angle. In addition, the blade 162 may be configured such that the pitch thereof is constant. The blade 162 may be made of a thermal conductive material. Also, the material of the blade 162 may be a moisture-resistant material.

As such, the rotator 160 which includes the center shaft 161 and the spiral blade 162 provided around the center shaft 161 can be rotated by cooling water that is supplied into the pipe. Then, the cooling water which passes through the pipe is also rotated by the rotator 160 that is rotated by the cooling water.

Figure 7:
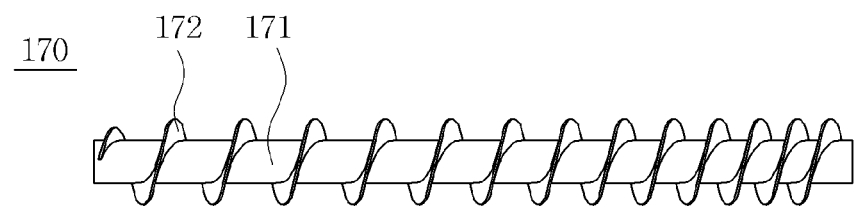
FIG. 7 is a view illustrating another embodiment of the rotator according to the present invention.

FIG. 7 is a view illustrating another embodiment of the rotator according to the present invention.

Referring to FIG. 7, the rotator 170 includes a center shaft 171 and a blade 172.

The rotator 170 is disposed in each pipe of the heat dissipation unit through which cooling water passes.

The center shaft 171 is cylindrical. The center shaft 171 extends a predetermined length in the longitudinal direction of the pipe into which the rotator 170 is inserted. The length of the center shaft 171 is equal to or less than that of the pipe into which the rotator 170 is inserted. In other words, the maximum length of the rotator 170 is the same as that of the pipe. The length of the rotator 170 is not limited to this, and it can be easily understood by those skilled in this art that modifications are possible. The center shaft 171 may be made of a thermal conductive material. In addition, the material of the center shaft 171 may be a moisture-resistant material.

The blade 172 is provided in a spiral shape around the outer surface of the center shaft 171. Further, the blade 172 may be configured such that a wide surface thereof is angled to the center shaft 171 at a predetermined angle. In addition, the blade 172 may be configured such that the pitch thereof is reduced from a first side to a second side of the rotator 170. Here, the first side of the rotator 170 refers to a side into which cooling water is supplied into the pipe, and the second side refers to a side from which the cooling water is discharged to the outside. The blade 172 may be made of a thermal conductive material. Also, the material of the blade 172 may be a moisture-resistant material. As such, because the pitch of the blade 172 is reduced from the first side to the second side of the rotator 170, as cooling water moves from the first side to the second side of the rotator 170, the contact area between the cooling water and the blade 172 increases. Here, in consideration of the thermal conductive material of the blade 172, the more the contact area between the blade 172 and cooling water which absorbs heat increases as the cooling water moves from the first side to the second side of the rotator 170, the higher is the heat transfer rate from the cooling water to the blade 172. Therefore, the temperature of cooling water can be maintained at a uniform degree from the first side to the second side of the rotator 170, thus enhancing the heat dissipation efficiency of the semiconductor module.

Figure 8:
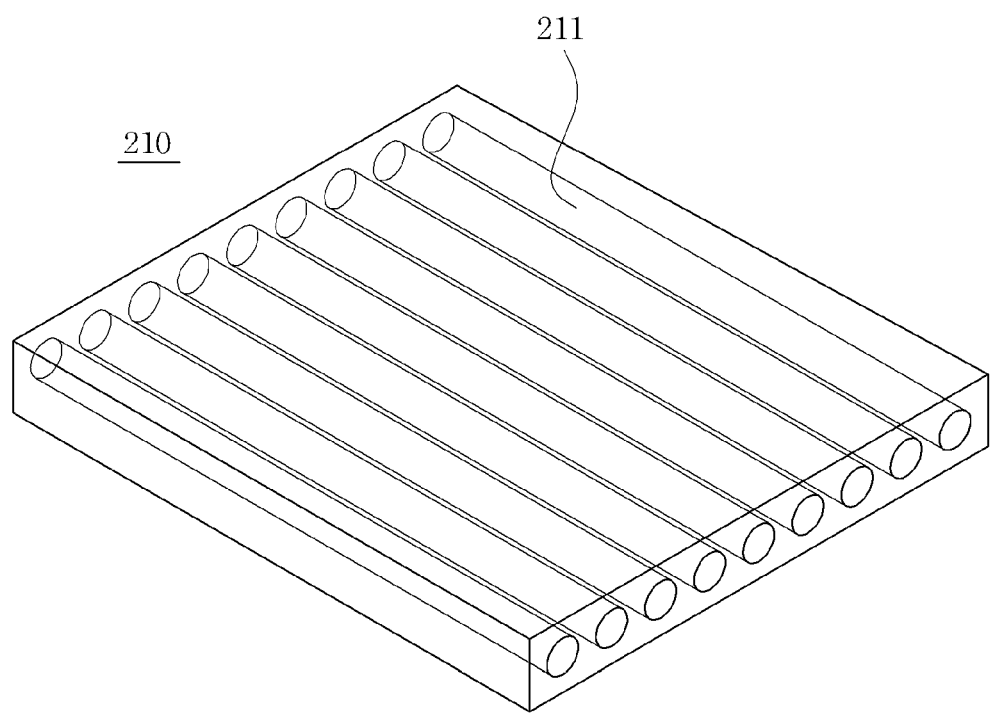
FIG. 8 is a view showing a conventional heat dissipation unit.
Figure 9:
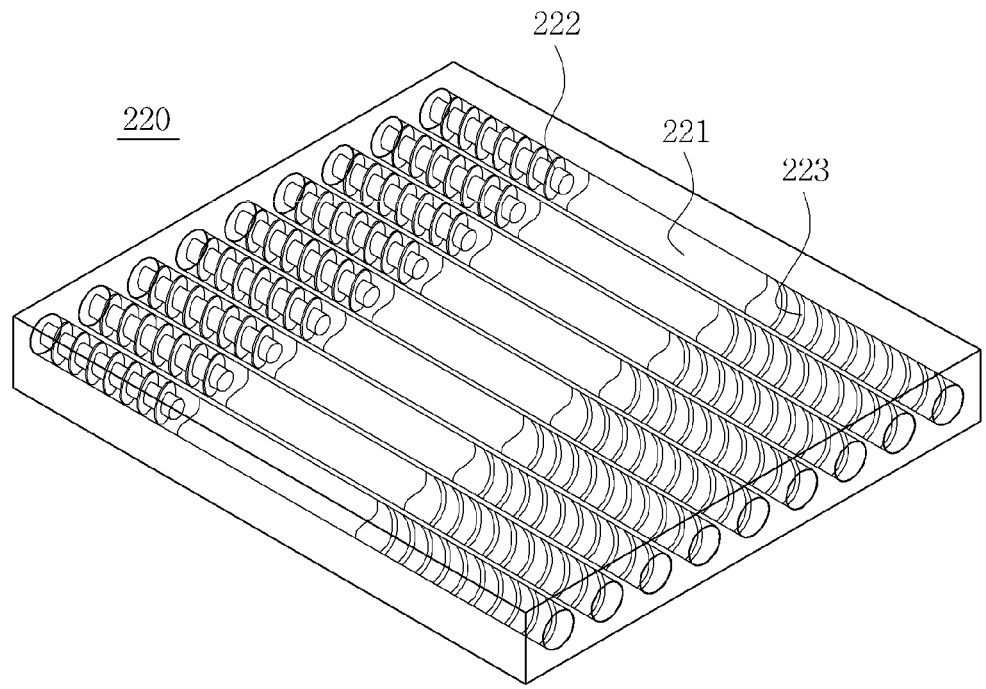
FIG. 9 is a view showing an embodiment of a heat dissipation unit according to the present invention.
Figure 10:
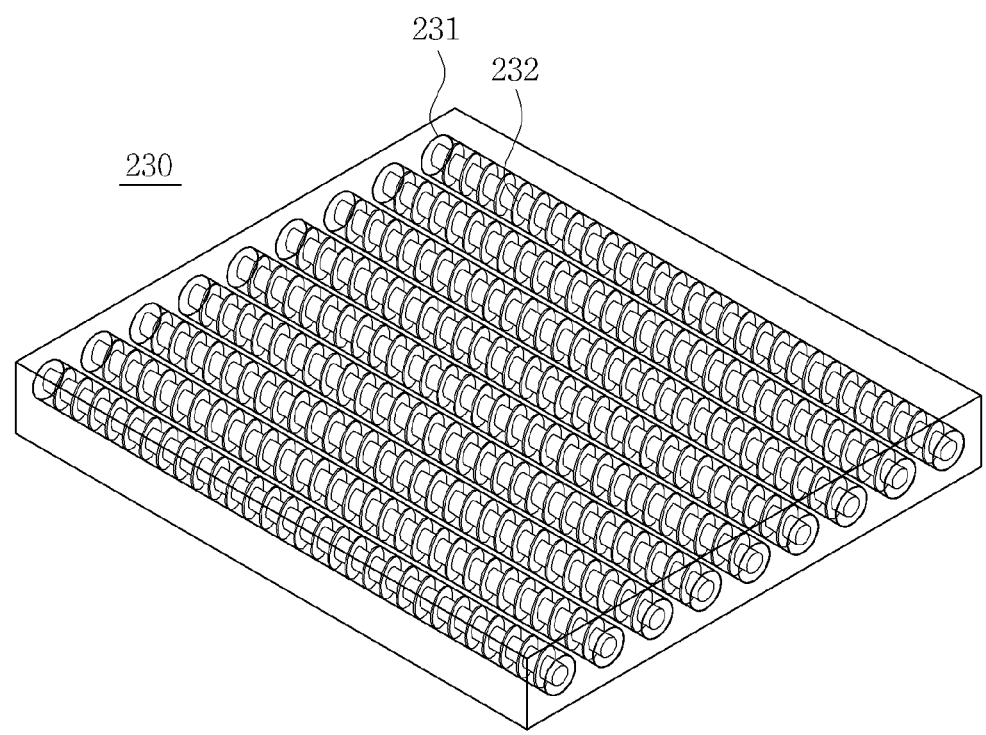
FIG. 10 is a view showing another embodiment of a heat dissipation unit according to the present invention.

FIGS. 8 through 10 are views showing several heat dissipation units provided to test for the heat dissipation efficiency.

FIG. 8 is a view showing the conventional heat dissipation unit.

Referring to FIG. 8, a conventional third heat dissipation unit 210 includes a plurality of third pipes 211 through which cooling water passes.

FIG. 9 is a view showing an embodiment of a heat dissipation unit according to the present invention.

Referring to FIG. 9, a fourth heat dissipation unit 220 includes a plurality of fourth pipes 221 through which cooling water passes. In the fourth heat dissipation unit 220, each fourth pipe 221 has a fourth rotator 222 and a fourth groove 223 therein. The fourth rotator 222 is disposed in a first side of the fourth pipe 221 into which cooling water is supplied. The fourth groove 223 is formed in a second side of the fourth pipe 221 from which the cooling water is discharged to the outside.

The fourth groove 223 may be formed in a spiral shape in the inner surface of the second side of the fourth pipe 221.

FIG. 10 is a view showing another embodiment of a heat dissipation unit according to the present invention.

Referring to FIG. 10, a fifth heat dissipation unit 230 includes a plurality of fifth pipes 231 through which cooling water passes. In the fifth heat dissipation unit 230, each fifth pipe 231 has a fifth rotator 232 therein. The fifth rotator 232 extends the whole length of the fifth pipe 231. For example, the length of the fifth rotator 232 is the same as that of the fifth pipe 231.

Cooling water is supplied into the heat dissipation units of the FIGS. 8 through 10 at the same pressure. Here, the temperature of the cooling water is 27° C. The heat flux applied to each heat dissipation unit of the FIGS. 8 through 10 is 90 KW/m$^2$, and the thermal pressure is 5 Pa. The term "heat flux" refers to the rate of heat energy transfer through a given surface for a given time.

Figure 11:
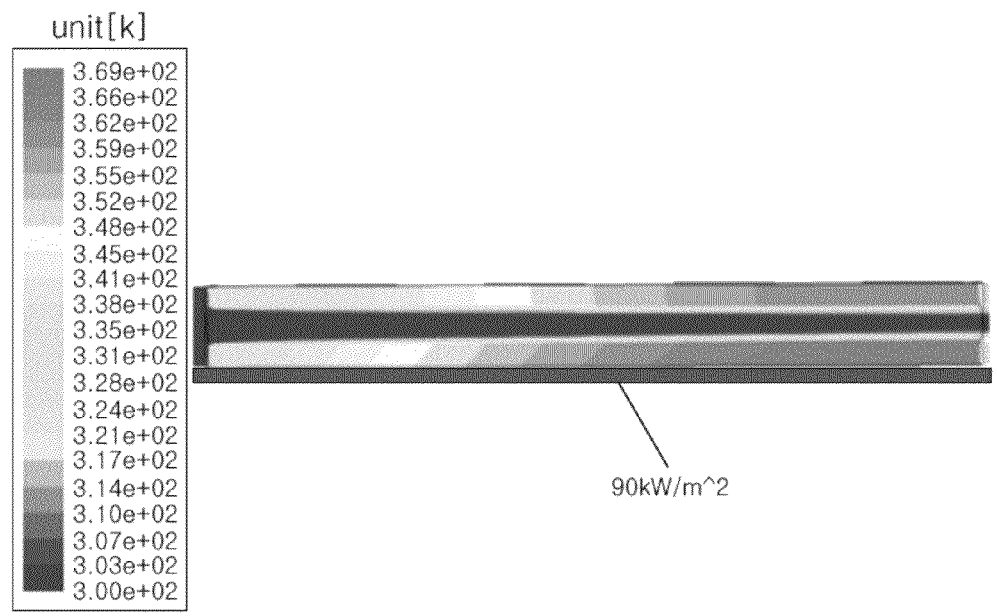
FIG. 11 is a view showing the result of a heat dissipation efficiency test for the conventional heat dissipation unit.
Figure 12:
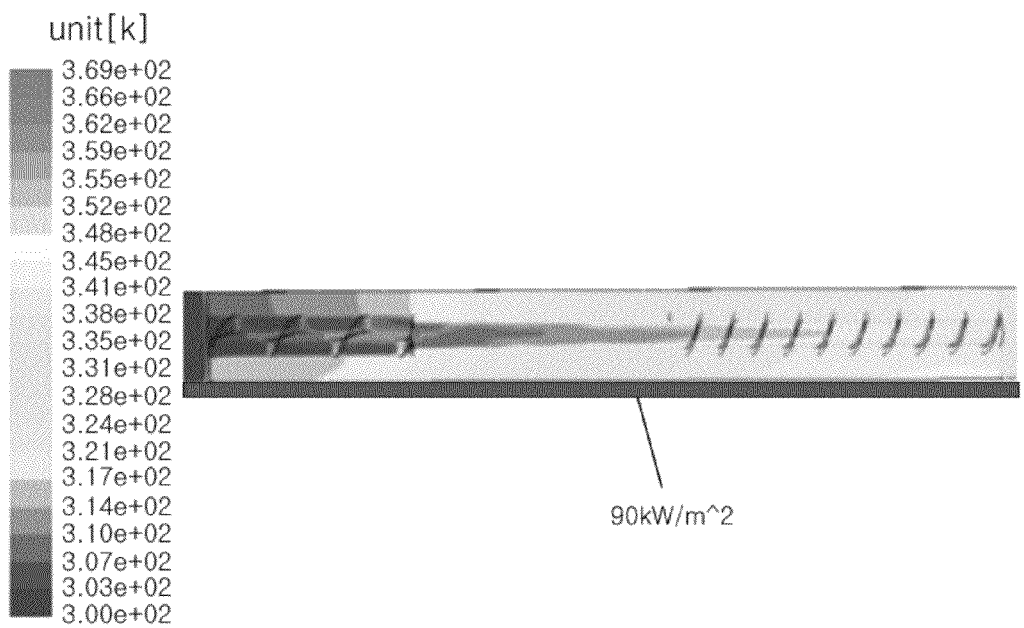
FIG. 12 is a view showing the result of a heat dissipation efficiency test for a heat dissipation unit of FIG. 9.
Figure 13:
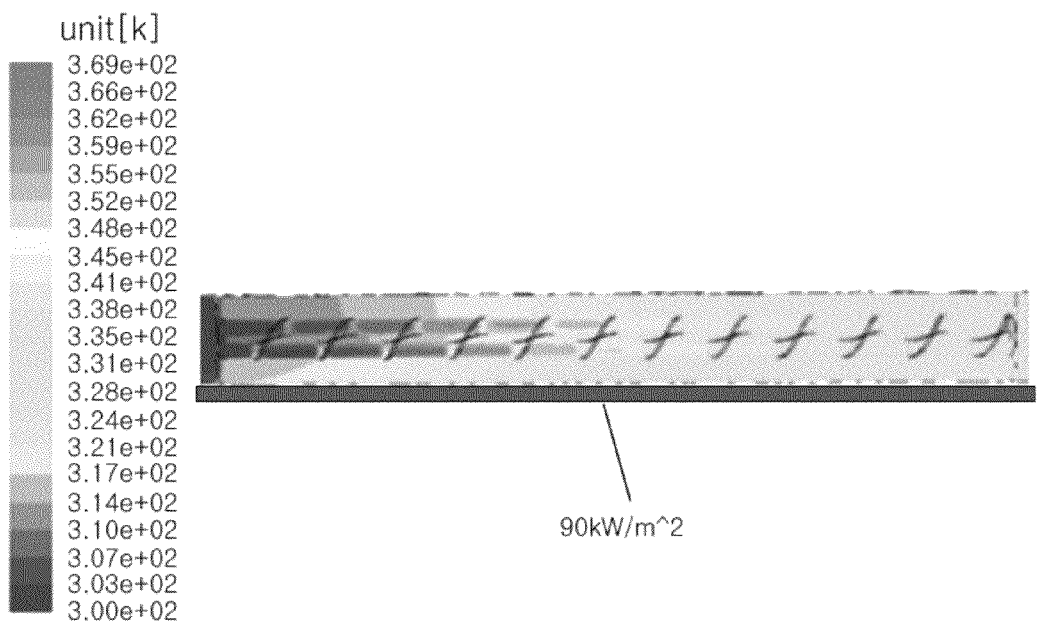
FIG. 13 is a view showing the result of a heat dissipation efficiency test for the heat dissipation unit of FIG. 10.

FIGS. 11 through 13 are views showing the results of the heat dissipation efficiency tests for the heat dissipation units.

FIG. 11 is a view showing the result of the heat dissipation efficiency test for the conventional heat dissipation unit.

In detail, FIG. 11 illustrates the result of the heat dissipation efficiency test for the conventional heat dissipation unit of FIG. 8. From the result of the test of FIG. 11, it was confirmed that the maximum temperature of cooling water that passes through the third heat dissipation unit (210 of FIG. 8) which is the conventional heat dissipation unit was about 96° C.

For reference, the legend is shown in the drawing and makes use of absolute temperature to illustrate the temperature in the result of the heat dissipation efficiency test. As shown in the drawing, the temperature ranges from 3.00e+02K to 3.69e+02K. Here, e+10 refers to $10^2$. In other words, 3.00e+02K refers to 300K, and 3.69e+02K refers to 369K. If the temperature range of the legends is designated by Celsius temperature, it is from 27° C. to 96° C. This temperature distribution of the legends can also be applied to those of FIGS. 12 and 13 in the same manner.

FIG. 12 is a view showing the result of a heat dissipation efficiency test for a heat dissipation unit according to an embodiment of the present invention.

In detail, FIG. 12 illustrates the result of the heat dissipation efficiency test for the heat dissipation unit of FIG. 9 according to the present invention. From the result of the test of FIG. 12, it was confirmed that the maximum temperature of cooling water that passes through the fourth heat dissipation unit (220 of FIG. 9) which is the heat dissipation unit of this embodiment was about 69° C.

FIG. 13 is a view showing the result of a heat dissipation efficiency test for a heat dissipation unit according to another embodiment of the present invention.

In detail, FIG. 13 illustrates the result of the heat dissipation efficiency test for the heat dissipation unit of FIG. 10 according to the present invention. From the result of the test of FIG. 13, it was confirmed that the maximum temperature of cooling water that passes through the fifth heat dissipation unit (230 of FIG. 10) which is the heat dissipation unit of this embodiment was about 65° C.

From the results of the tests of FIGS. 11 through 13, it can be understood that the temperature of cooling water in the fourth heat dissipation unit (220 of FIG. 9) according to the embodiment of the present invention was reduced by 28% compared to that of the third heat dissipation unit (210 of FIG. 8) which is the conventional heat dissipation unit. Further, it can be understood that the temperature of cooling water in the fifth heat dissipation unit (230 of FIG. 10) according to the other embodiment of the present invention was reduced by 32% compared to that of the third heat dissipation unit (210 of FIG. 8) which is the conventional heat dissipation unit. As such, it can be confirmed that in the heat dissipation unit according to the present invention, the temperature of cooling water which flows through the heat dissipation unit can be maintained at a comparatively low temperature so that the heat dissipation efficiency can be enhanced compared to that of the conventional heat dissipation unit.

As described above, in a semiconductor package according to the present invention, heat dissipation units are respectively provided on and under a semiconductor module so that the heat dissipation efficiency can be enhanced. Furthermore, the semiconductor package can maintain the temperature of cooling water passing through the heat dissipation units at a comparatively low constant degree, thus further enhancing the heat dissipation efficiency.

Although the embodiments of the present invention have been disclosed for illustrative purposes, it will be appreciated that the semiconductor package according to the invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor package, comprising:
a semiconductor module having a semiconductor device;
a first heat dissipation unit provided under the semiconductor module, the first heat dissipation unit comprising at least one first pipe through which first cooling water passes, and a first rotator disposed in the first pipe so as to be rotatable;
a second heat dissipation unit provided on the semiconductor module, the second heat dissipation unit comprising at least one second pipe through which second cooling water passes, and a second rotator disposed in the second pipe so as to be rotatable; and
a housing provided on opposite sides of the semiconductor module, the first heat dissipation unit and the second heat dissipation unit, the housing supporting the semiconductor module, the first heat dissipation unit and the second heat dissipation unit.

2. The semiconductor package as set forth in claim 1, further comprising:
a first inlet port provided on a first surface of the housing so that the first cooling water is supplied from an outside into the first heat dissipation unit through the first inlet port; and
a second outlet port provided on the first surface of the housing so that the second cooling water which has been used in the second heat dissipation unit is discharged to the outside through the second outlet port.

3. The semiconductor package as set forth in claim 1, further comprising:
a first outlet port provided on a second surface of the housing so that the first cooling water which has been used in the first heat dissipation unit is discharged to the outside through the first outlet port; and
a second inlet port provided on the second surface of the housing so that the second cooling water is supplied from the outside into the second heat dissipation unit through the second inlet port.

4. The semiconductor package as set forth in claim 1, wherein the first rotator is disposed in a first side of the first pipe.

5. The semiconductor package as set forth in claim 1, wherein a first spiral groove is formed in an inner surface of a second side of the first pipe.

6. The semiconductor package as set forth in claim 1, wherein the first rotator has a length corresponding to a length of the first pipe.

7. The semiconductor package as set forth in claim 1, wherein the first rotator comprises:
   a cylindrical center shaft; and
   a spiral blade provided around an outer surface of the cylindrical center shaft.

8. The semiconductor package as set forth in claim 7, wherein a pitch of the spiral blade is constant.

9. The semiconductor package as set forth in claim 7, wherein a pitch of the spiral blade is reduced from a first side of the spiral center shaft to a second side thereof.

10. The semiconductor package as set forth in claim 1, wherein the first rotator is made of a thermal conductive material.

11. The semiconductor package as set forth in claim 1, wherein the second rotator is disposed in a second side of the second pipe.

12. The semiconductor package as set forth in claim 1, wherein a second spiral groove is formed in an inner surface of a first side of the second pipe.

13. The semiconductor package as set forth in claim 1, wherein the second rotator has a length corresponding to a length of the second pipe.

14. The semiconductor package as set forth in claim 1, wherein the second rotator comprises:
   a cylindrical center shaft; and
   a spiral blade provided around an outer surface of the cylindrical center shaft.

15. The semiconductor package as set forth in claim 14, wherein a pitch of the spiral blade is constant.

16. The semiconductor package as set forth in claim 14, wherein a pitch of the spiral blade is reduced from a first side of the spiral center shaft to a second side thereof.

17. The semiconductor package as set forth in claim 1, wherein the second rotator is made of a thermal conductive material.

* * * * *